United States Patent
Masuda

(10) Patent No.: US 8,552,304 B2
(45) Date of Patent: Oct. 8, 2013

(54) HIGH-FREQUENCY CIRCUIT PACKAGE AND HIGH-FREQUENCY CIRCUIT DEVICE

(75) Inventor: Satoshi Masuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 216 days.

(21) Appl. No.: 13/157,499

(22) Filed: Jun. 10, 2011

(65) Prior Publication Data

US 2012/0061133 A1 Mar. 15, 2012

(30) Foreign Application Priority Data

Sep. 10, 2010 (JP) .................................. 2010-203566

(51) Int. Cl.
*H05K 1/03* (2006.01)
(52) U.S. Cl.
USPC .......................................................... 174/258
(58) Field of Classification Search
USPC .......................................... 174/258; 333/246
See application file for complete search history.

(56) References Cited

U.S. PATENT DOCUMENTS

| | | | | |
|---|---|---|---|---|
| 4,372,046 A | * | 2/1983 | Suzuki | 29/852 |
| 4,821,007 A | * | 4/1989 | Fields et al. | 333/238 |
| 6,774,748 B1 | | 8/2004 | Ito | |
| 6,867,669 B2 | * | 3/2005 | Dov et al. | 333/247 |
| 7,486,157 B2 | | 2/2009 | Takagi | |
| 7,919,717 B2 | * | 4/2011 | Braman et al. | 174/262 |
| 2007/0080763 A1 | | 4/2007 | Takagi | |

FOREIGN PATENT DOCUMENTS

| | | |
|---|---|---|
| EP | 1 772 904 A2 | 4/2007 |
| EP | 1 772 904 A3 | 6/2007 |
| JP | 2000-100994 | 4/2000 |
| JP | 2000-133735 | 5/2000 |
| JP | 2001-144509 A1 | 5/2001 |
| JP | 2002-190541 A1 | 7/2002 |
| JP | 2007-81125 A1 | 3/2007 |

* cited by examiner

*Primary Examiner* — Chau Nguyen
(74) *Attorney, Agent, or Firm* — Kratz, Quintos & Hanson, LLP

(57) ABSTRACT

A high-frequency circuit package including a dielectric substrate; a signal line, a first ground conductor layer, a second ground conductor layer, and a frame-shaped dielectric layer formed on the dielectric substrate; a third ground conductor layer formed on the frame-shaped dielectric layer; a first recess formed in the frame-shaped dielectric layer and including a first surface and a second surface that are located above the first ground conductor layer and the second ground conductor layer and extend laterally at an oblique angle with respect to the length direction of the signal line; a first ground line formed on the first surface and electrically connecting the first ground conductor layer with the third ground conductor layer; and a second ground line formed on the second surface and electrically connecting the second ground conductor layer with the third ground conductor layer.

15 Claims, 13 Drawing Sheets

HIGH-FREQUENCY CIRCUIT PACKAGE AND HIGH-FREQUENCY CIRCUIT DEVICE

CROSS-REFERENCE TO RELATED APPLICATION

This application is based upon and claims the benefit of priority of Japanese Patent Application No. 2010-203566 filed on Sep. 10, 2010, the entire contents of which are incorporated herein by reference.

FIELD

The embodiments discussed herein are related to a package for a high-frequency circuit and a high-frequency circuit device.

BACKGROUND

Recent advancement of broadband technologies has enabled high-speed, high-volume wireless communications such as cell-phone networks and public wireless LANs. Also, to meet the demand for high-volume data communications, third-generation base station amplifiers have become widely used and fourth-generation base station amplifiers will be introduced. Further, introduction of new communication schemes such as WiMAX may accelerate the advancement of high-speed, high-volume wireless communications.

Meanwhile, there is a demand for a high-power, wideband radar amplifier that can increase the detection range and resolution of a radar system. Also, it is desired to reduce the operational costs and the size of a cooler for a radar amplifier.

For a phased array radar where radar modules including amplifiers are arranged in an array in a small space, it is desired to reduce the size of the radar modules and thereby to arrange the radar modules more densely.

In a radar transceiver module, components such as an amplifier and passive elements each housed in a package are further placed in a metal high-frequency circuit package. The components are connected to each other via wiring on a printed-circuit board.

Also, there are high-frequency circuit packages with laminated structures that are made of, for example, high temperature co-fired ceramic (HTCC) or low temperature co-fired ceramic (LTCC).

A known ceramic high-frequency circuit package includes a planar dielectric layer and a frame-shaped dielectric layer formed on the planar dielectric layer. In the ceramic high-frequency circuit package, a signal conductor is formed on the upper surface of the planar dielectric layer, and first ground conductor layers are formed on the sides of the signal conductor at a distance from the signal conductor. A second ground conductor layer is formed on the lower surface of the planar dielectric layer and a third ground conductor layer is formed on the upper surface of the frame-shaped dielectric layer. The region surrounded by the frame-shaped dielectric layer forms a cavity where a semiconductor device is mounted.

The frame-shaped dielectric layer may include a feedthrough (see, for example, Japanese Laid-Open Patent Publication No. 2001-144509).

In a known configuration, the feedthrough is implemented by multiple via holes formed in the frame-shaped dielectric layer and connects the third ground conductor layer on the frame-shaped dielectric layer with the first ground conductor layers below the frame-shaped dielectric layer. Ground castellations with a semicircular shape may also be embedded in the side surfaces of the frame-shaped dielectric layer.

When via holes are used as the feedthrough, the distance between an edge of the third ground conductor layer formed on the upper surface of the frame-shaped dielectric layer and the via holes formed in the frame-shaped dielectric layer may be set at substantially zero (see, for example, Japanese Laid-Open Patent Publication No. 2000-100994).

As another example, the feedthrough may be implemented by castellation conductors formed on the surfaces of recesses formed in the inner and outer side surfaces of the frame-shaped dielectric layer (see, for example, Japanese Laid-Open Patent Publication No. 2002-190541). The castellation conductors extend laterally in directions that are orthogonal to the length direction of the first ground conductor layers. The castellation conductors electrically connect the third ground conductor layer on the frame-shaped dielectric layer with the first ground conductor layers below the frame-shaped dielectric layer, and have a width that is the same as the width of the first ground conductor layers.

In a known technology, the width of a feedthrough at the output terminal side and the widths of parts of a micro strip line, i.e., a signal line, inside and outside of the feedthrough are adjusted to keep the characteristic impedance within an allowable range (see, for example, Japanese Laid-Open Patent Publication No. 2007-081125).

Another known high-frequency circuit package includes a package wall that surrounds a high-frequency integrated circuit (see, for example, Japanese Laid-Open Patent Publication No. 2000-133735). A feedthrough for inputting and outputting signals to and from the high-frequency integrated circuit is formed in the package wall. The feedthrough includes a first microstrip line, a dielectric loaded waveguide, and a second microstrip line.

The first microstrip line is disposed inside of the package wall. The dielectric loaded waveguide is disposed to pass through the package wall. One end of the dielectric loaded waveguide is electromagnetically coupled with the first microstrip line. The second microstrip line is disposed outside of the package wall and is electromagnetically coupled with the other end of the dielectric loaded waveguide.

SUMMARY

According to an aspect of the invention, there is provided a high-frequency circuit package that includes a dielectric substrate including an edge area; a signal line formed on the dielectric substrate and extending from the edge area toward an inner area of the dielectric substrate; a first ground conductor layer and a second ground conductor layer formed on sides of the signal line and disposed at a distance from the signal line; a frame-shaped dielectric layer formed on the dielectric substrate so as to overlap parts of the signal line, the first ground conductor layer, and the second ground conductor layer and to expose the signal line, the first ground conductor layer, and the second ground conductor layer in the edge area; a third ground conductor layer formed on the upper surface of the frame-shaped dielectric layer; and a first recess formed in the frame-shaped dielectric layer above the signal line, the first ground conductor layer, and the second ground conductor layer. The first recess includes a first surface located above the first ground conductor layer and extending laterally at an oblique angle with respect to the length direction of the signal line and a second surface located above the second ground conductor layer and extending laterally at an oblique angle with respect to the length direction of the signal line. The high-frequency circuit package further includes a first ground line formed on the first surface of the first recess and configured to electrically connect the first ground conductor layer with the third ground conductor layer, and a second ground line formed on the second surface of the first recess and configured to electrically connect the second ground conductor layer with the third ground conductor layer.

The object and advantages of the invention will be realized and attained by means of the elements and combinations particularly pointed out in the claims.

It is to be understood that both the foregoing general description and the followed detailed description are exemplary and explanatory and are not restrictive of the invention as claimed.

DESCRIPTION OF EMBODIMENTS

With a related-art high-frequency circuit package where a feedthrough is implemented by multiple metal via holes arranged at predetermined intervals in the length direction of a signal line, the metal via holes and ceramic parts having different thermal expansion coefficients are arranged alternately. This configuration tends to reduce the mechanical strength of the high-frequency circuit package.

Meanwhile, with a related-art high-frequency circuit package where a feedthrough is implemented by ground castellations formed in recesses in the inner and outer side surfaces of a frame-shaped dielectric layer, it is necessary to increase the depth of the recesses to increase the areas of the ground castellations. However, increasing the depth of the recesses increases the facing area of a pair of ground castellations that face each other via a signal line. This in turn increases the parasitic capacitance between the ground castellations.

Also in the related-art, a cavity formed by the frame-shaped dielectric layer is covered by a metal lid. Accordingly, after the lid is mounted on the frame-shaped dielectric layer, the parasitic capacitance of components in the cavity changes, and this in turn causes the electrical characteristics of the components to change.

An aspect of this disclosure makes it possible to solve or reduce one or more of the above problems and to provide a high-frequency circuit package and a high-frequency circuit device with improved electrical characteristics.

Preferred embodiments of the present invention are described below with reference to the accompanying drawings. Throughout the accompanying drawings, the same reference numbers are assigned to the same components.

Figure 1:
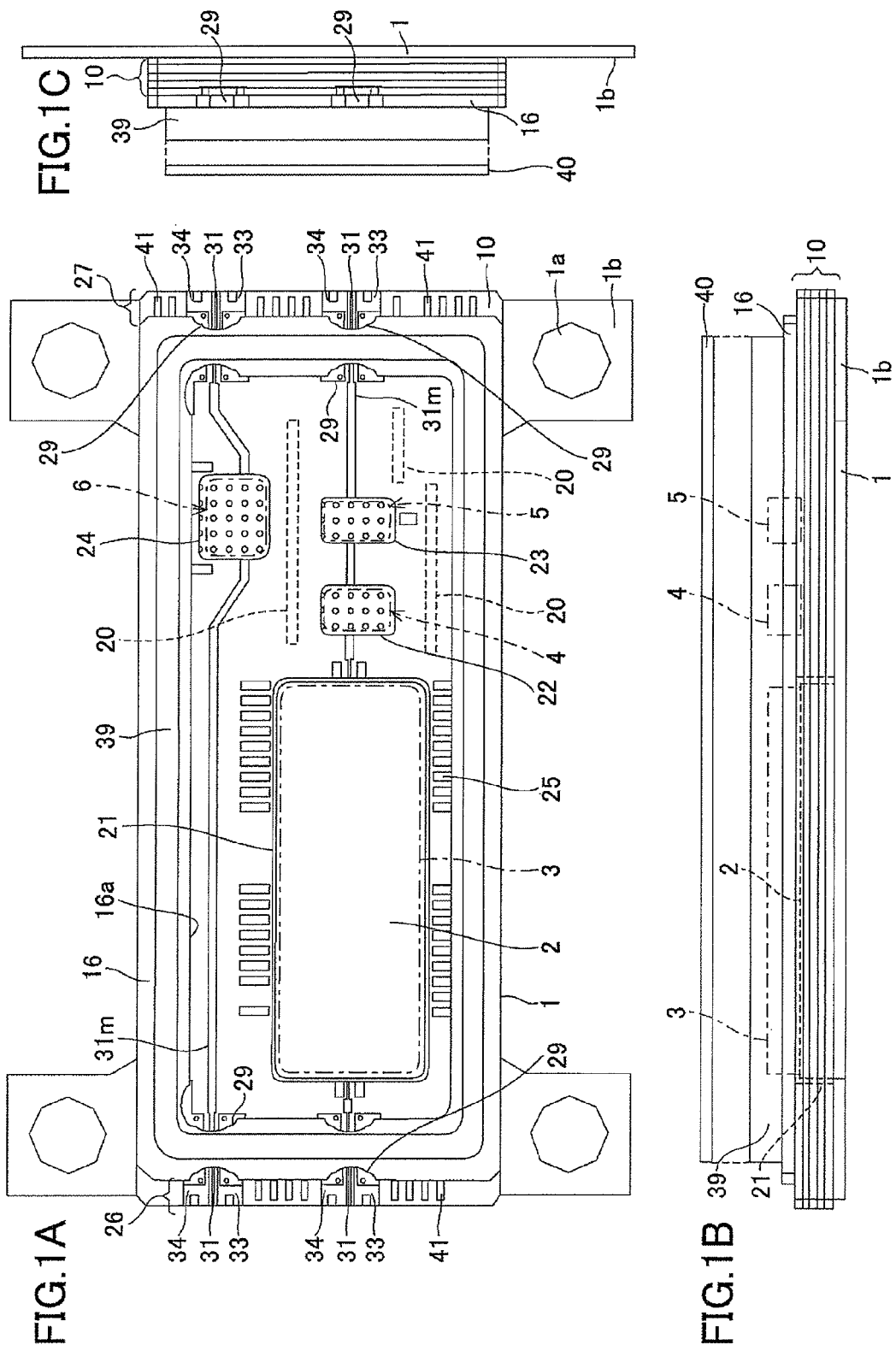
FIGS. 1A through 1C are a plan view, a side view, and an end view of a high-frequency circuit device including a high-frequency circuit package according to an embodiment.
Figure 2:
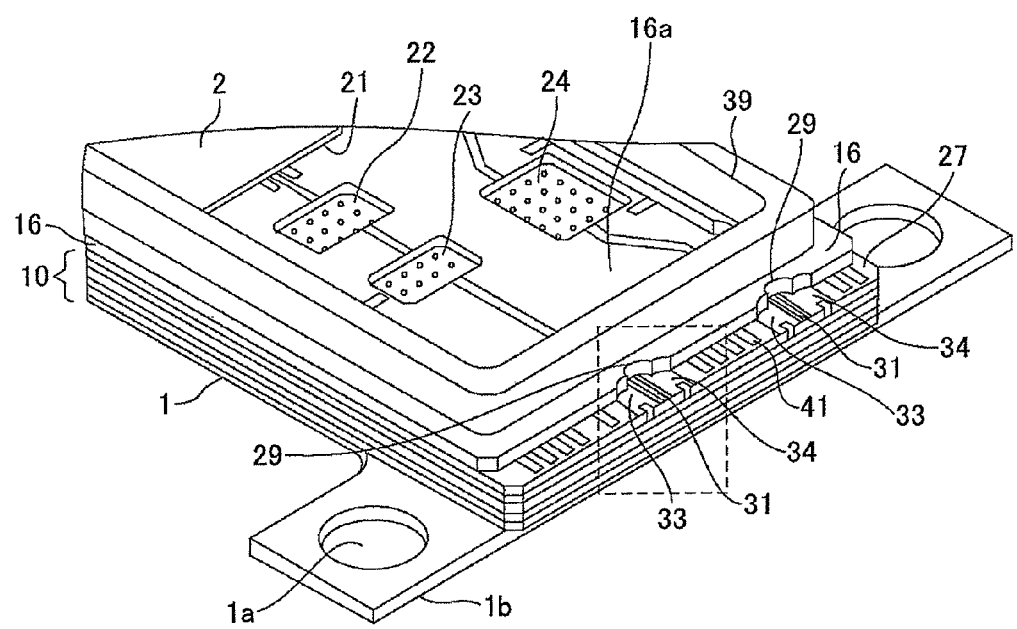
FIG. 2 is a perspective view of a part of a high-frequency circuit package.
Figure 3:
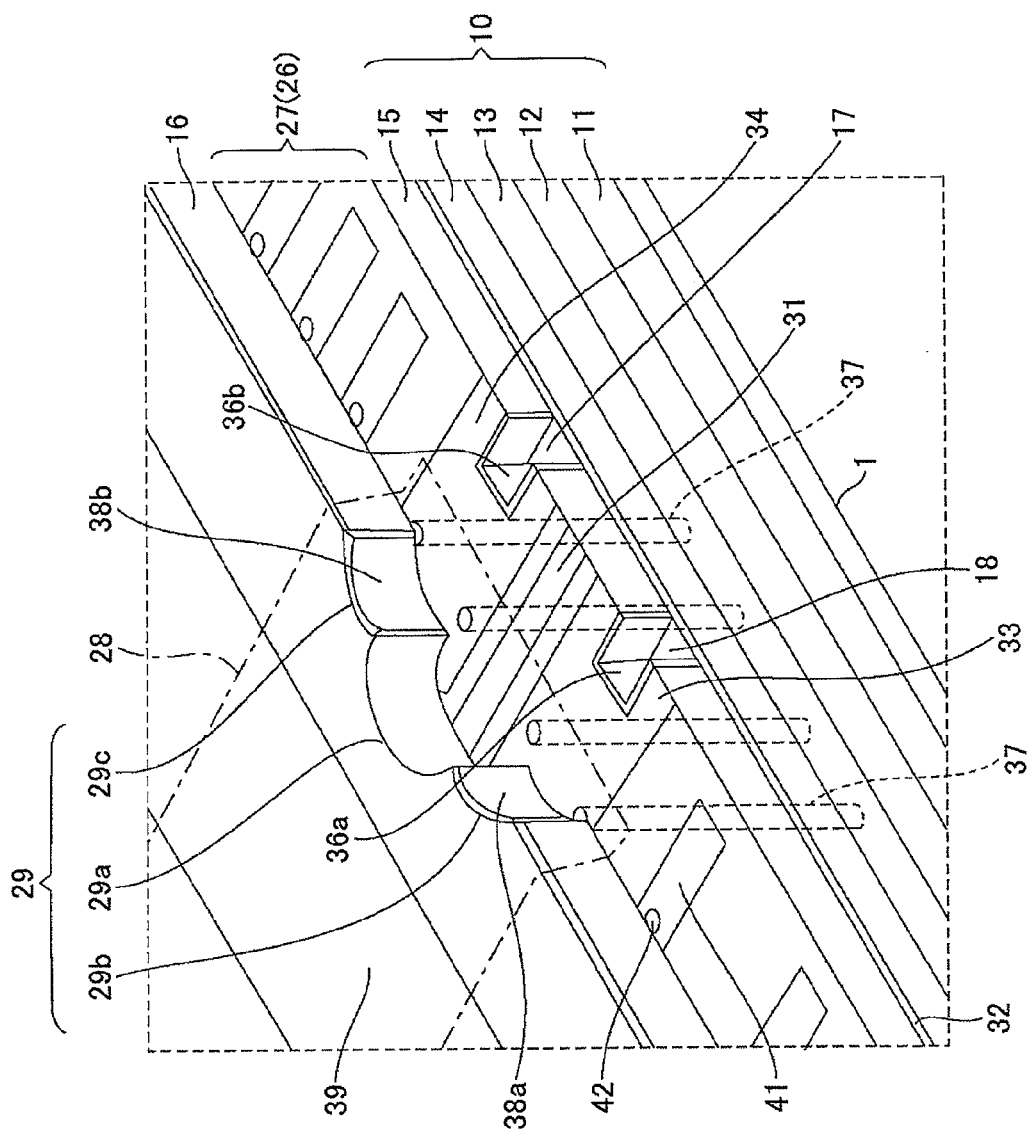
FIG. 3 is an enlarged perspective view of a part of the high-frequency circuit package of FIG. 2.

FIGS. 1A through 1C are a plan view, a side view, and an end view of a high-frequency circuit device including a high-frequency circuit package according to an embodiment of the present invention. FIG. 2 is a perspective view of a part of the high-frequency circuit package of FIGS. 1A through 1C. FIG. 3 is an enlarged view of a region of the high-frequency circuit package enclosed by a dotted line in FIG. 2.

As illustrated in FIGS. 1A through 3, the high-frequency circuit package may include a metal base 1 and a dielectric substrate 10 bonded to the metal base 1 by, for example, silver brazing. The dielectric substrate 10 includes, for example, alumina ceramic.

The metal base 1 is made of a metal material including, for example, kovar (KOV), copper tungsten (CuW), and/or copper molybdenum (CuMo) and functions as a ground conductor. Flanges 1b having through holes 1a are formed at four corners of the metal base 1. The flanges 1b protrude from the sides of the dielectric substrate 10.

A protrusion 2 is formed on the metal base 1 through an opening 21 formed in a first component mounting area of the dielectric substrate 10. A high-power device 3 such as a monolithic microwave integrated circuit (MMIC) may be mounted on the protrusion 2.

The protrusion 2 is preferably made of a material with high radiation performance that includes, for example, KOV, CuW, and/or CuMo. The protrusion 2 may be formed as an integral part of the metal base 1 or may be bonded to the metal base 1 by, for example, silver brazing. Also, the protrusion 2 may be configured to function as a heat sink when a higher-power device is used.

The dielectric substrate 10 may have a laminated ceramic structure. In the example of FIGS. 2 and 3, the dielectric substrate 10 includes first through fifth ceramic layers (dielectric layers) 11-15. Each of the ceramic layers 11-15 may have a thickness of, for example, about 0.25 mm. As indicated by dotted lines in FIG. 1A, internal wires 20 are formed between the ceramic layers 11-15. Also, via holes (not shown) are formed through the ceramic layers 11-15 to connect the internal wires 20 that are arranged one above the other. For example, vias made of a metal such as tungsten are embedded in the via holes.

The ceramic layers 11-15 may be alumina layers and formed by firing layers of green sheets at a temperature of about 1600° C.

First through third recesses 22, 23, and 24 are formed in second, third, and fourth component mounting areas on the dielectric substrate 10. Functional devices 4, 5, and 6 such as high-power devices or filters are mounted in the first through third recesses 22, 23, and 24.

External connection areas (edge areas) 26 and 27 are provided at the front and rear ends of the dielectric substrate 10. A frame-shaped dielectric layer 16 is formed on the upper surface of the dielectric substrate 10 in an area between the external connection areas 26 and 27. The frame-shaped dielectric layer 16 may have a thickness of, for example, about 0.38 mm. An area surrounded by the frame-shaped dielectric layer 16 is called a cavity 16a. The cavity 16a includes the first through fourth component mounting areas where the high-power device 3 and the functional devices 4 through 6 are mounted.

Signal lines 31 are formed on the upper surface of the uppermost layer, i.e., the fifth ceramic layer 15 of the dielectric substrate 10. The signal lines 31, respectively, extend from the external connection areas 26 and 27, pass under the frame-shaped dielectric layer 16, and enter the cavity 16a. For example, two signal lines 31 may be formed for each of the external connection areas 26 and 27.

Figure 4A:
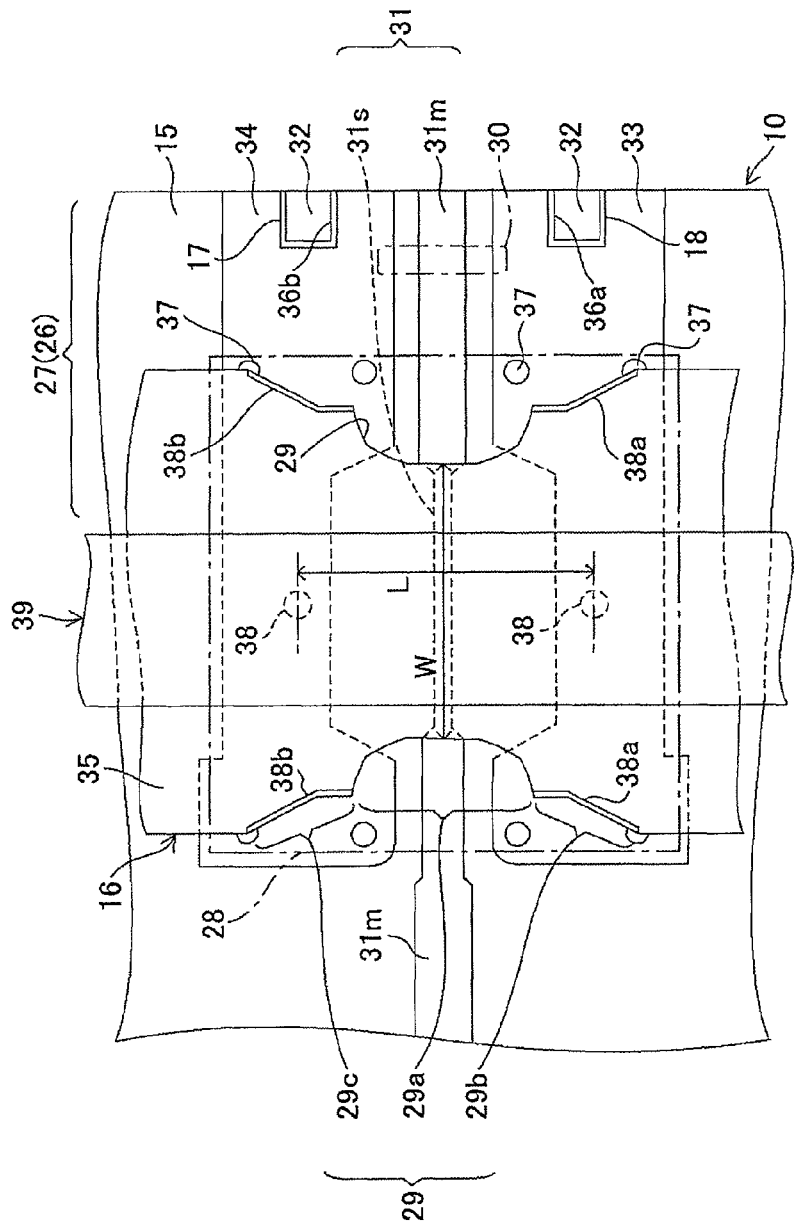
FIG. 4A is a plan view of a part of a high-frequency circuit package.
Figure 4B:
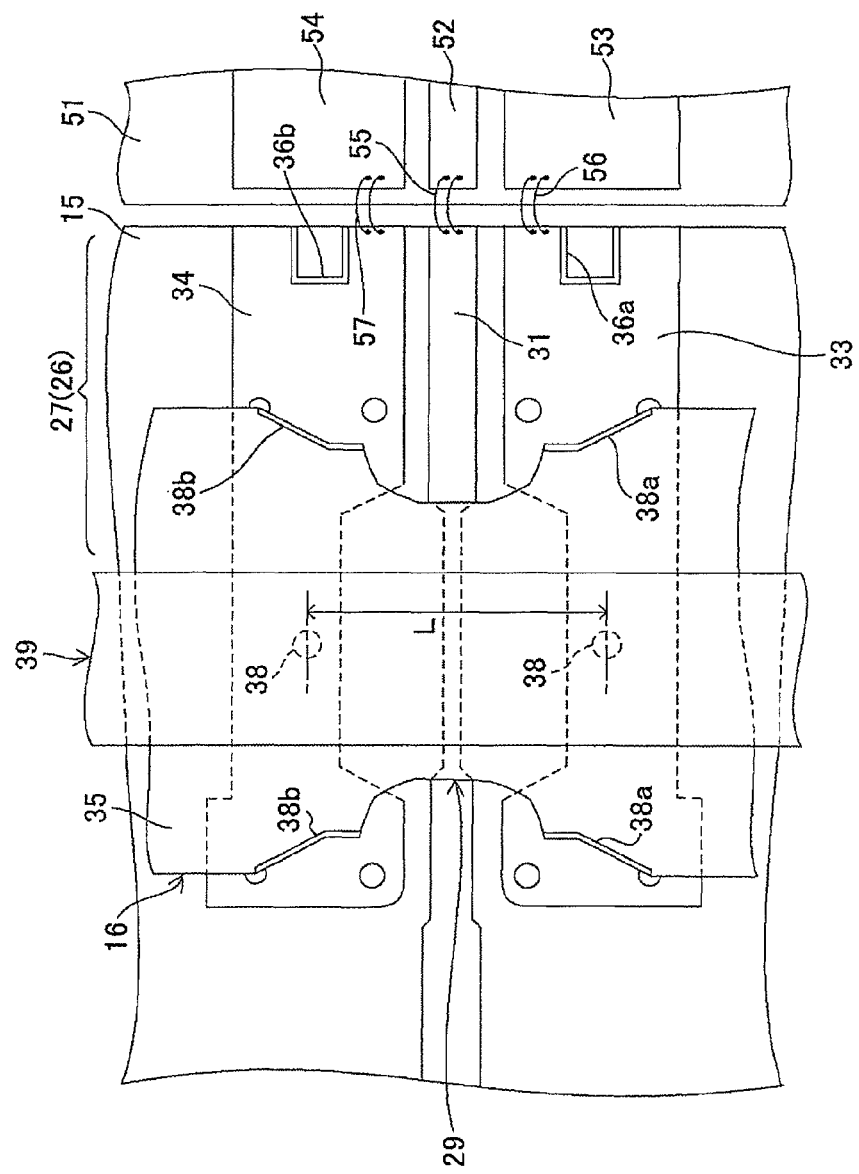
FIG. 4B is a plan view of a high-frequency circuit package connected with wiring of a system case.

As illustrated in FIG. 4A, a part of the signal line 31 that is sandwiched between the frame-shaped dielectric layer 16 and the dielectric substrate 10 is implemented by a strip line 31s and other parts of the signal line 31 are implemented by a microstrip line(s) 31m. The width of the strip line 31s is less than the width of the microstrip line 31m.

As illustrated in FIG. 3, a first ground conductor layer 32 is formed between the fourth ceramic layer 14 and the fifth ceramic layer 15. Stripe-shaped second and third ground conductor layers 33 and 34 are formed on the fifth ceramic layer 15. The second and third ground conductor layers 33 and 34 are disposed on the corresponding sides of the signal line 31 at a distance from the signal line 31.

The second and third ground conductor layers 33 and 34 extend from the external connection area 27 (or 26), pass under the frame-shaped dielectric layer 16, and enter the cavity 16a. The length of parts of the second and third ground conductor layers 33 and 34 in the cavity 16a may be less than the length of a part of the signal line 31 in the cavity 16a.

With the above configuration, as illustrated in FIG. 4A, a coplanar line 30 is formed by the signal line 31 and the second and third ground conductor layers 33 and 34. Also, as illustrated in FIGS. 3 and 4A, a part of the frame-shaped dielectric layer 16 intersecting with the signal line 31 and the second and third ground conductor layers 33 and 34 forms a feedthrough 28.

Recesses 17 and 18 passing through the fifth ceramic layer 15 are formed at ends of the second and third ground conductor layers 33 and 34 outside of the frame-shaped dielectric layer 16. The recesses 17 and 18 form cubic spaces and expose the first ground conductor layer 32.

First and second ground lines 36a and 36b called castellation conductors are formed on the inner side surfaces of the recesses 17 and 18. The first ground line 36a electrically connects the second ground conductor layer 33 and the first ground conductor layer 32 that are arranged one above the other. The second ground line 36b electrically connects the third ground conductor layer 34 and the first ground conductor layer 32 that are arranged one above the other. The first ground conductor layer 32 and the coplanar line 30 form a ground coplanar line.

The second and third ground conductor layers 33 and 34 are electrically connected with the first ground conductor layer 32 and the metal base 1 by first via holes 37 that pass through the first through fifth ceramic layers 11-15. The first via holes 37 are formed by filling holes formed in the first through fifth ceramic layers 11-15 with a conductive material such as tungsten.

Alternatively, the first via holes 37 may be formed so as to pass through only the first through fourth ceramic layers 11-14, i.e., not to pass through the fifth ceramic layer 15. In this case, the first via holes 37 electrically connect the first ground conductor layer 32 with the metal base 1.

The distance between the signal line 31 and the second and third ground conductor layers 33 and 34 may be large in an area where they are overlapped by (or intersect with) the frame-shaped dielectric layer 16 and may be small in other areas. The width of the microstrip line 31m of the signal line 13 in the cavity 16a may be the largest in an area where the microstrip line 31m is not sandwiched between the second and third ground conductor layers 33 and 34.

In the feedthrough 28 illustrated in FIG. 4A, recesses 29 are formed in the inner and outer side surfaces of the frame-shaped dielectric layer 16 at positions where the frame-shaped dielectric layer 16 overlaps (or intersects with) the signal line 31 and the second and third ground conductor layers 33 and 34. Each pair of the recesses 29 in the inner and outer side surfaces of the frame-shaped dielectric layer 16 are symmetrical to each other. The depth of the recess 29 gradually increases as it becomes closer to the signal line 31. Accordingly, the width of the frame-shaped dielectric layer 16 is the smallest at a position directly above the signal line 31. The inner surface of the recess 29 is orthogonal to the upper surface of the dielectric substrate 10.

The recess 29 includes a first indented part 29a that is located above an area between the second and third ground conductor layers 33 and 34 and has a curved surface the center of which is most indented. The recess 29 also includes second and third indented parts 29b and 29c that are located above the second and third ground conductor layers 33 and 34, respectively. The surfaces of the second and third indented parts 29b and 29c extend laterally at an oblique angle (or an acute angle) with respect to the length direction of the signal line 31. Accordingly, the surfaces of the second and third indented parts 29b and 29c are at an angle with each other. Also, the surfaces of the second and third indented parts 29b and 29c may be at an angle (e.g., an oblique angle) with the surface of the first indented part 29a. Further, the second and third indented parts 29b and 29c may have bent or curved surfaces.

Third and fourth ground lines (castellation conductors) 38a and 38b are formed on the surfaces of the second and third indented parts 29b and 29c. The third and fourth ground lines 38a and 38b electrically connect the second and third ground conductor layers 33 and 34 with a fourth ground conductor layer 35 formed on the frame-shaped dielectric layer 16.

Second via holes 38 are formed in the frame-shaped dielectric layer 16 above the second and third ground conductor layers 33 and 34. The second via holes 38 electrically connect the fourth ground conductor layer 35 with the second and third ground conductor layers 33 and 34. The second via holes 38 are formed at positions away from the third and fourth ground lines 38a and 38b.

The second via holes 38 are formed by filling holes formed in the frame-shaped dielectric layer 16 with, for example, tungsten.

An exemplary method of forming the first through fifth ceramic layers 11-15 and the frame-shaped dielectric layer 16 is described below.

Green sheet chips used as the materials of the first through fifth ceramic layers 11-15 and the frame-shaped dielectric layer 16 are formed by punching a ceramic green sheet. Next, the internal wires 20, the signal lines 31, the first through third ground conductor layers 32, 33, and 34, and the first via holes 37 are formed on or in five layers of the green sheet chips corresponding to the first through fifth ceramic layers 11-15. For example, the internal wires 20, the signal lines 31, the first through third ground conductor layers 32, 33, and 34, and the first via holes 37 are formed by screen printing using a conductive material such as tungsten or molybdenum. Next, the second via holes 38 are formed in a frame-shaped green sheet chip corresponding to the frame-shaped dielectric layer 16, and the fourth ground conductor layer 35 is formed on the upper surface of the frame-shaped dielectric layer 16.

A conductive paste is applied by screen printing to the inner surfaces of the recesses 17 and 18 formed at the ends of the green sheet chip corresponding to the fifth ceramic layer 15. Similarly, a conductive paste is applied by screen printing to the surfaces of the second and third indented parts 29b and 29c of the recesses 29 formed in the frame-shaped green sheet chip corresponding to the frame-shaped dielectric layer 16. Examples of the conductive paste include a tungsten paste and a molybdenum paste.

Then, the six layers of the green sheet chips are stacked (or laminated) and fired at a temperature of about 1600° C. Through the above steps, a structure where the frame-shaped dielectric layer 16 is stacked on the dielectric substrate 10 is produced.

A metal frame 39 is bonded by silver brazing to the fourth ground conductor layer 35 on the frame-shaped dielectric layer 16 as illustrated in FIGS. 1A through 4A. The width of the metal frame 39 may be less than a width W of a part of the frame-shaped dielectric layer 16 above the signal line 31. The metal frame 39 may include, for example, kovar (KOV).

As illustrated in FIG. 1B, after the high-power device 3 and the functional devices 4, 5, and 6 are mounted in the cavity 16a, a lid 41 with a thickness of, for example, about 0.3 mm is placed on and bonded to the metal frame 39 to cover the cavity 16a. In plan view, the lid 40 has substantially the same shape as the outline of the metal frame 39. For example, the lid 40 is fusion-bonded via AuSn (gold-tin) in a nitrogen atmosphere at a temperature of about 300° C.

Using the metal frame 39 makes it possible to hermetically seal the high-frequency circuit package by seam welding and thereby to improve the sealing yield. Here, it is preferable to keep an appropriate distance between the high-power device 3 and the lid 40 to reduce the parasitic capacitance and thereby to prevent a change in the performance (or characteristics) of the high-power device 3.

As illustrated in FIGS. 1A and 2 through 4A, in addition to the second and third ground conductor layers 33 and 34 and the signal lines 31, lines 41 such as power supply lines are formed on the dielectric substrate 10. The lines 41 are connected through via holes 42 to the internal wires 20 in the dielectric substrate 10. Also, electrodes 25 are formed on the dielectric substrate 10 around the opening 21.

As described above, the recesses 29 are formed in a part of the frame-shaped dielectric layer 16 forming the feedthrough 28 above the signal line 31 and the second and third ground conductor layers 33 and 34.

The first indented part 29a, which is the center portion and the deepest part of the recess 29, is located above the signal line 31. In other words, the width W of a part of the frame-shaped dielectric layer 16 above the signal line 31 is smaller than the width(s) of other parts of the frame-shaped dielectric layer 16. This configuration makes it possible to increase the width of the other parts of the frame-shaped dielectric layer 16 and thereby makes it possible to prevent reduction in the mechanical strength of the frame-shaped dielectric layer 16. Also, this configuration makes it possible to reduce the area of a part of the signal line 31 that is covered by the frame-shaped dielectric layer 16 and thereby makes it possible to reduce the line loss.

The recess 29 also includes the second and third indented parts 29b and 29c that are located above the second and third ground conductor layers 33 and 34. The surfaces of the second and third indented parts 29b and 29c extend laterally at an oblique angle with respect to the length direction of the signal line 31 and are also orthogonal to the upper surface of the dielectric substrate 10.

With this configuration, it is possible to dispose the third and fourth ground lines 38a and 38b close to the signal line 31 by decreasing the angle between the surfaces of the second and third indented parts 29b and 29c. Also with this configuration, since the third and fourth ground lines 38a and 38b facing each other across the signal line 1 are not parallel to each other, the parasitic capacitance between the third and fourth ground lines 38a and 38b does not increase greatly even if they are disposed close to each other or their areas are increased.

Also, since the third and fourth ground lines 38a and 38b are orthogonal to the upper surface of the dielectric substrate 10 and are at an angle with each other, increasing the thickness of the third and fourth ground lines 38a and 38b makes it possible to increase the mechanical strength of the high-frequency circuit package against pressure from above.

According to the above embodiment, the third and fourth ground lines 38a and 38b extend laterally at an oblique angle with respect to the length direction of the signal line 31. Compared with a configuration where the third and fourth ground lines 38a and 38b are disposed orthogonal to the length direction of the signal line 31, the configuration of the above embodiment makes it possible to reduce the average distance between the signal line 31 and the third and fourth ground lines 38a and 38b and thereby makes it possible to reduce the parasitic inductance component.

Also, compared with a configuration where the third and fourth ground lines 38a and 38b are disposed orthogonal to the length direction of the signal line 31, the configuration of the above embodiment makes it possible to reduce the width of the third and fourth ground lines 38a and 38b seen from the front or rear end (where the external connection area 26 or 27 is located) of the dielectric substrate 10. This in turn makes it possible to reduce the width of the third and fourth ground conductor layers 33 and 34 to which the third and fourth ground lines 38a and 38b are connected and thereby makes it possible to reduce the size of the high-frequency circuit package.

Figure 5:
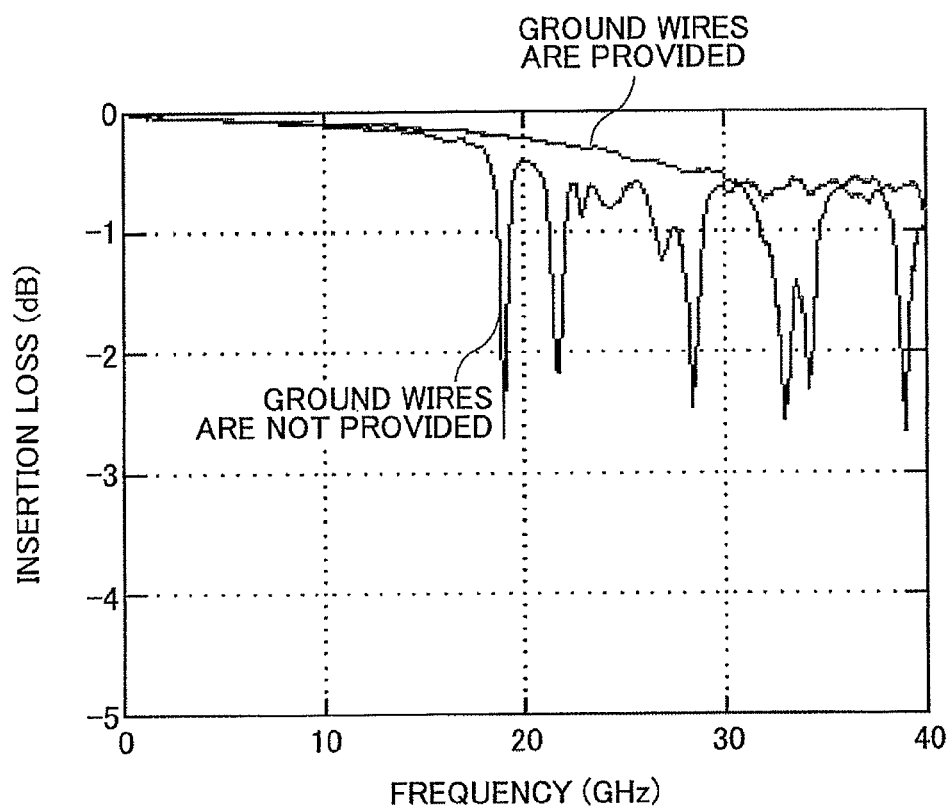
FIG. 5 is a graph representing relationships between frequencies and insertion losses of high-frequency circuit packages.

FIG. 5 is used to describe the results of an experiment where transmission characteristics of the high-frequency circuit package of this embodiment and a high-frequency circuit package of a comparative example were evaluated. In the high-frequency circuit package of this embodiment, as described above, the second and third ground conductor layers 33 and 34 are connected with the fourth ground conductor layer 35 via the third and fourth ground lines 38a and 38b formed on the surfaces of the second and third indented parts 29b and 29c. In the high-frequency circuit package of the comparative example, the second and third ground conductor layers 33 and 34 are not connected with the fourth ground conductor layer 35. In the experiment, a high-frequency signal probe was brought into contact with the signal line 31 to examine the relationships between frequencies and insertion losses of the high-frequency circuit packages.

As in FIG. 5, with the high-frequency circuit package of the comparative example (not including the third and fourth ground lines 38a and 38b), the insertion loss drastically increases when the frequency exceeds about 17 GHz. Meanwhile, with the high-frequency circuit package of this embodiment (including the third and fourth ground lines 38a and 38b), the insertion loss does not drastically increase even when the frequency is increased up to about 40 GHz. Thus, the configuration of this embodiment makes it possible to provide a high-frequency circuit device that has a low signal loss and supports a wide frequency band.

The third and fourth ground lines 38a and 38b, i.e., ground castellations, are also present on bonding pads in the external connection areas 26 and 27. This configuration makes it possible to reduce the line loss caused by ground discontinuity of the bonding pads and thereby makes it possible to support a higher frequency.

In a part of the signal line 31 implemented by the strip line 31s, the distance between the signal line 31 and the ground conductor layers 33 and 34 is increased and the width of the signal line 31 is reduced. This configuration makes it possible to provide a transmission line with a characteristic impedance of, for example, 50 ohm.

When the high-frequency circuit device including the high-frequency circuit package of this embodiment is mounted in a system case, the ground coplanar line formed in the dielectric substrate 10 is connected to a ground coplanar line on a wiring board 51 of the system case. A signal line 52 and first and second ground conductor layers 53 and 54 are formed on the wiring board 51. The first and second ground conductor layers 53 and 54 are disposed on the corresponding sides of the signal line 52 at a distance from the signal line 52.

The signal line 52 on the wiring board 51 and the signal line 31 on the dielectric substrate 10 are connected to each other via a conductive wire 55. Similarly, the first ground conductor layer 53 on the wiring board 51 and the first ground conductor layer 33 on the dielectric substrate 10 are connected to each other via a conductive wire 56. Also, the second ground conductor layer 54 on the wiring board 51 and the second ground conductor layer 34 on the dielectric substrate 10 are connected to each other via a conductive wire 57.

Connecting the ground coplanar line of the high-frequency circuit package with the ground coplanar line of the system case as in the above configuration makes it possible to prevent ground discontinuity and thereby to reduce the transmission loss.

Another experiment was performed to examine the influence of a distance L between the second via holes 38 above the second and third ground conductor layers 33 and 34 on supportable frequencies.

Figure 6:
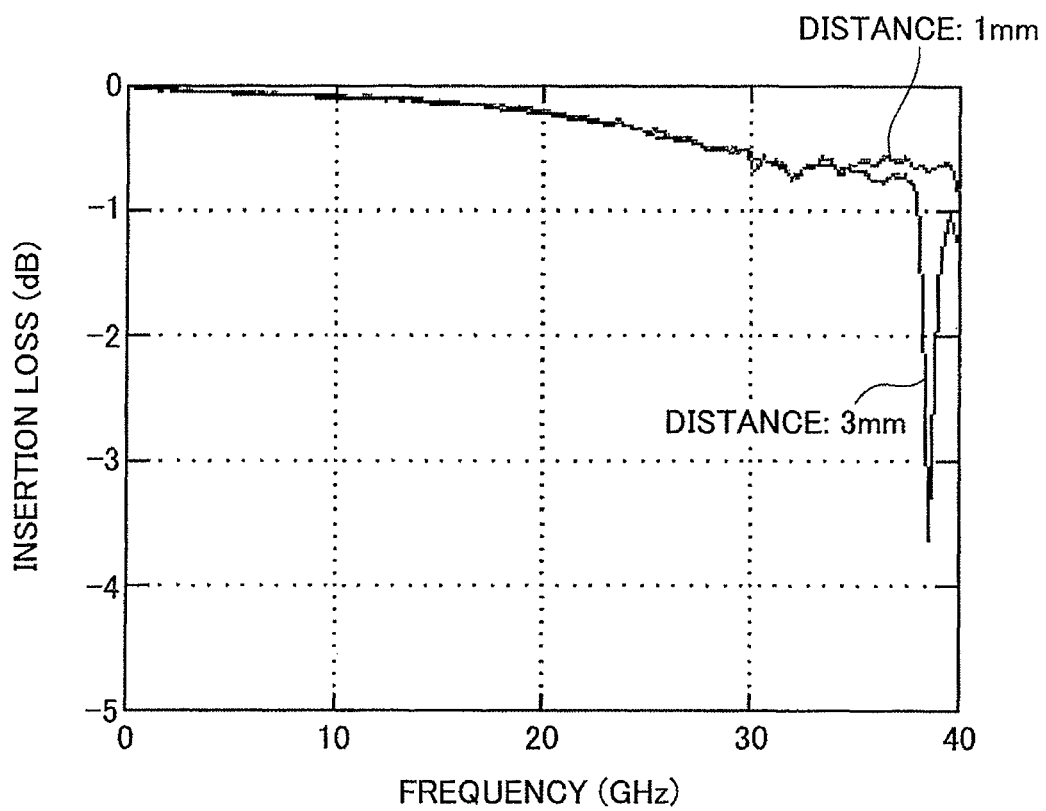
FIG. 6 is a graph representing relationships between distances of via holes and insertion losses of high-frequency circuit packages.

In the experiment, a high-frequency circuit package with the distance L of 1 mm and a high-frequency circuit package with the distance L of 3 mm were used. FIG. 6 represents the results of the experiment where the relationship between the frequency and the insertion loss in each of the high-frequency circuit packages was examined.

With the high-frequency circuit package where the distance L is 3 mm, the insertion loss started to increase drastically from a frequency of about 35 GHz. With the high-frequency circuit package where the distance L is 1 mm, the insertion loss did not drastically increase up to a frequency of about 40 GHz. The results indicate that it is preferable to set the distance L between the second via holes 38 at one half or less of the effective wavelength to provide a high-frequency circuit device that supports a wide frequency band.

Here, an effective wavelength $\lambda g$ may be represented by $\lambda/(\sqrt{\in})$ where $\in$ indicates the dielectric constant of the dielectric layer(s) and $\lambda$ indicates the wavelength of a signal transmitted via the signal line 31.

As described above, the third and fourth ground lines 38a and 38b extend laterally at an oblique angle with respect to the length direction of the signal line 31 so that the distance between the signal line 31 and the third and fourth ground lines 38a and 38b can be reduced. The results in FIG. 6 also prove that this configuration makes it possible to provide a high-frequency circuit device that supports a wide frequency band.

Figure 7:
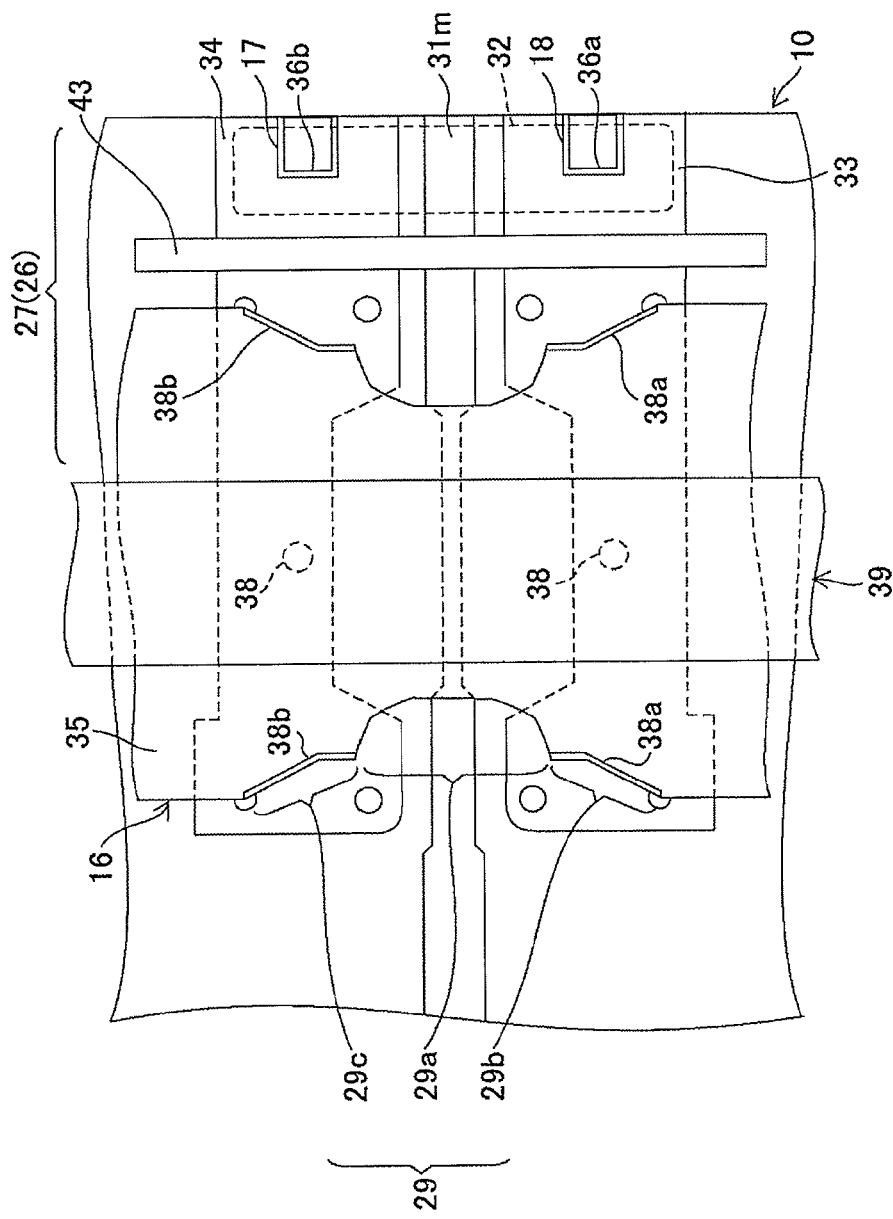
FIG. 7 is a drawing illustrating another example of a high-frequency circuit package.

FIG. 7 is a drawing illustrating another example of a high-frequency circuit package.

In the high-frequency circuit package of FIG. 7, a ceramic protrusion 43 is formed above the second and third ground conductor layers 33 and 34 in the external connection area 27 (or 26) of the dielectric substrate 10. The ceramic protrusion 43 is disposed at a distance from the frame-shaped dielectric layer 16.

The ceramic protrusion 43 is formed by stacking a strip of green sheet, which extends from the second ground conductor layer 33 to the third ground conductor layer 34, on layers of green sheets corresponding to the first through fifth ceramic layers 11-15 and by firing the green sheets.

Providing the ceramic protrusion 42 makes it possible to prevent the conductive paste applied to the surfaces of the second and third indented parts 29b and 29c of the recess 29 in the frame-shaped dielectric layer 16 from flowing along the second and third ground conductor layers 33 and 34 into bonding areas at the ends the second and third ground conductor layers 33 and 34 during a firing process.

In other words, providing the ceramic protrusion 42 makes it possible to prevent the bonding area at the ends of the second and third ground conductor layers 33 and 34 from being contaminated and thereby makes it possible to provide good external connections. Here, the conductive paste that is melted during the firing process can flow along the upper surfaces of the second and third ground conductor layers 33 and 34 that have good wettability, but can hardly flow along the upper surface of the fifth ceramic layer 15 made of a green sheet with poor wettability.

Figure 8:
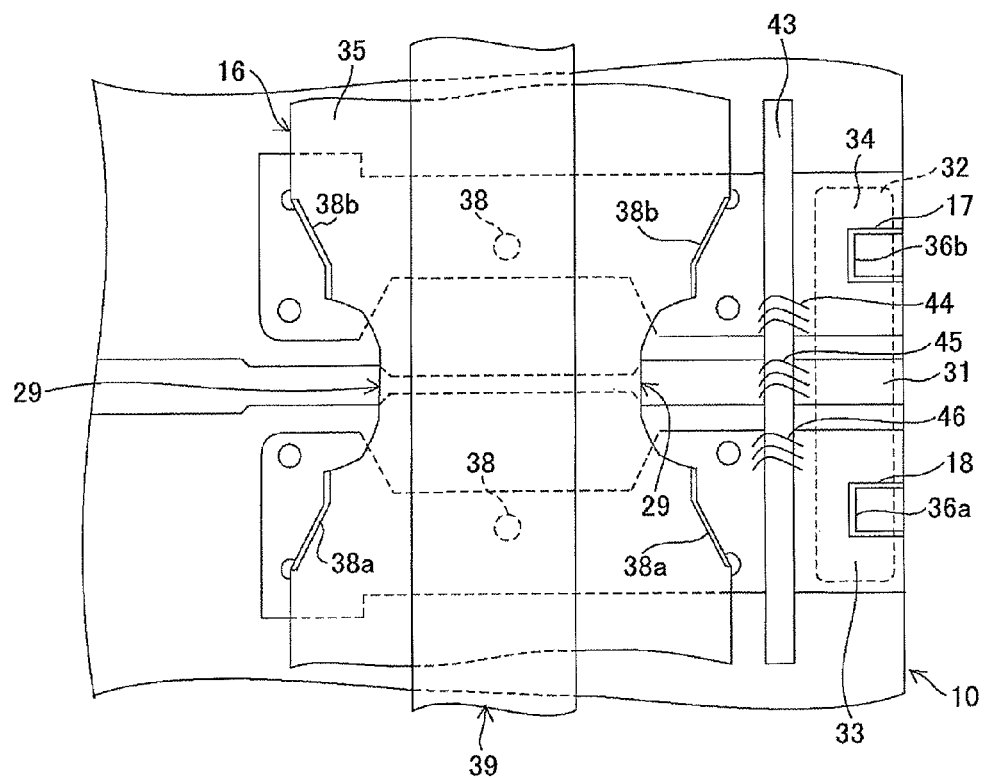
FIG. 8 is a drawing illustrating another example of a high-frequency circuit package.

FIG. 8 illustrates another example of a high-frequency circuit package where the signal line 31 and the second and third ground conductor layers 33 and 34 are not formed under the ceramic protrusion 43. In this configuration, parts of the signal line 31 and the second and third ground conductor layers 33 and 34 before and after the ceramic protrusion 42 are connected to each other using conductive wires 44, 45, and 46 (i.e., by wire bonding).

Bypassing the ceramic protrusion 43 using the conductive wires 44, 45, and 46 makes it possible to reduce the line loss of the signal line 31 and the second and third ground conductor layers 33 and 34 and thereby makes it possible to mount a high-power device.

The conductive wires 44, 45, and 46 may be implemented, for example, by gold wires. Using wire bonding makes it possible to reduce the resistance loss. Instead of the conductive wires 44, 45, and 46, ribbon wires may be used. Wire bonding may also be used even when the signal line 31 and the second and third ground conductor layers 33 and 34 are formed under the ceramic protrusion 42.

Figure 9:
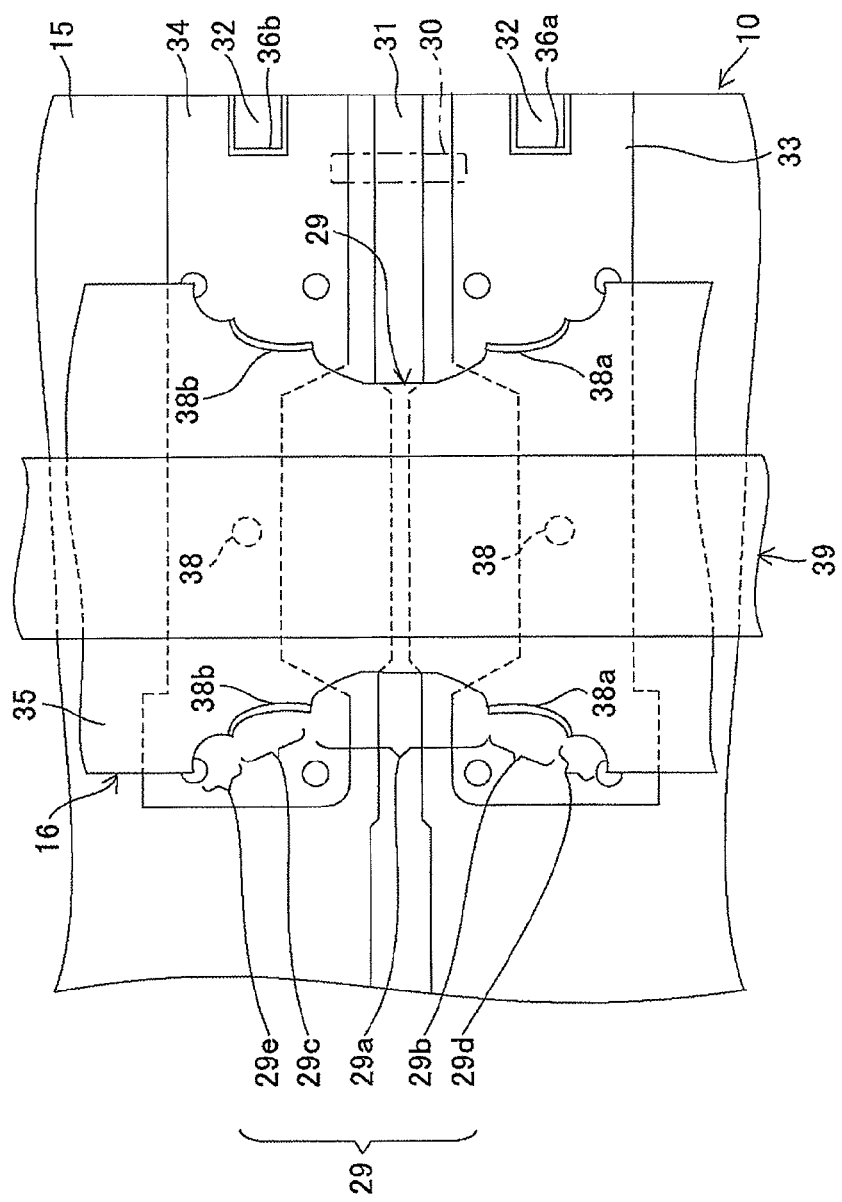
FIG. 9 is a drawing illustrating another example of a frame-shaped dielectric layer of a high-frequency circuit package.

FIG. 9 illustrates another exemplary shape of the recess 29 formed in a part of the frame-shaped dielectric layer 16 forming the feedthrough 28.

The recess 29 illustrated in FIG. 9 includes a first indented part 29a with a curved surface, second and third indented parts 29b and 29c disposed next to the first indented part 29a, and fifth and sixth indented parts 29d and 29e disposed next to the second and third indented parts 29b and 29c. The depth of the recess 29 gradually increases from the fifth and sixth indented parts 29d and 29e to the first indented part 29a.

With this configuration, there is a wide distance between the fifth and sixth indented parts 29d and 29e, and forming the third and fourth ground lines 38a and 38b on the fifth and sixth indented parts 29d and 29e may degrade the frequency band characteristics. For this reason, the third and fourth ground lines 38a and 38b are formed on the surfaces of the second and third indented parts 29b and 29c.

Figure 10:
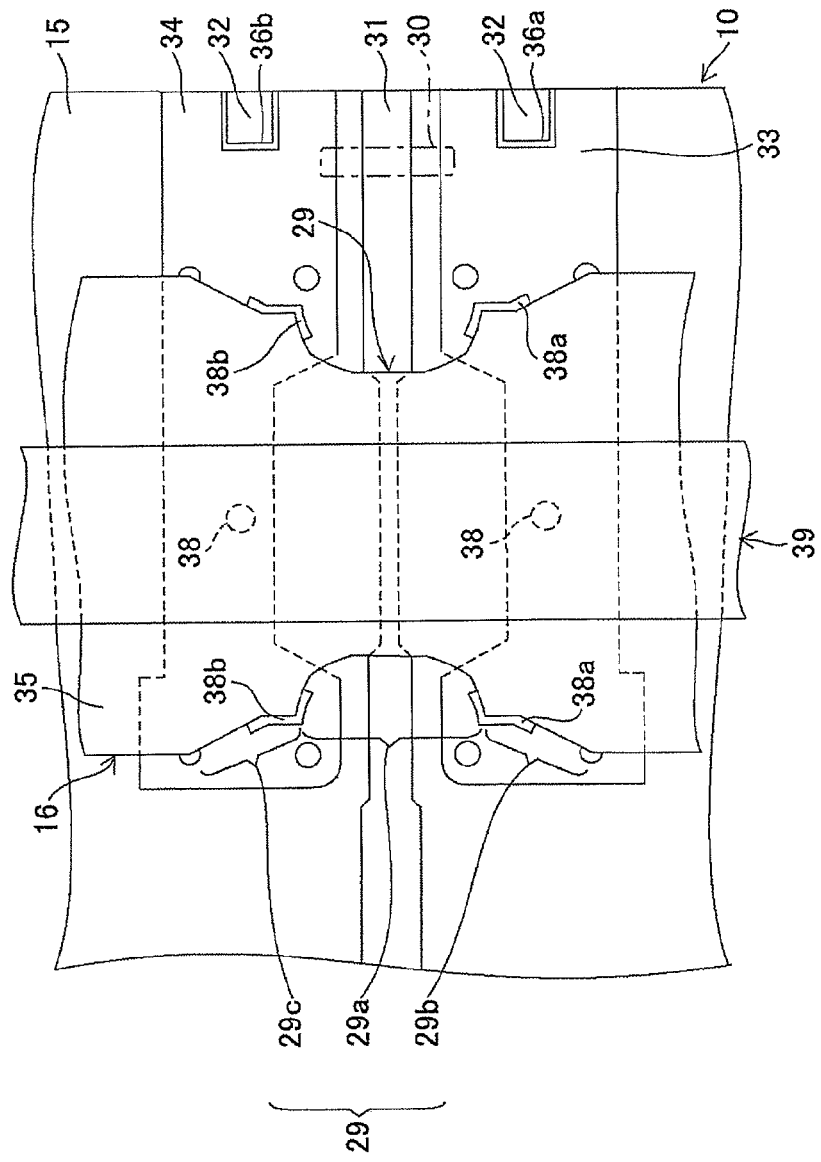
FIG. 10 is a drawing illustrating another example of a frame-shaped dielectric layer of a high-frequency circuit package.
Figure 11:
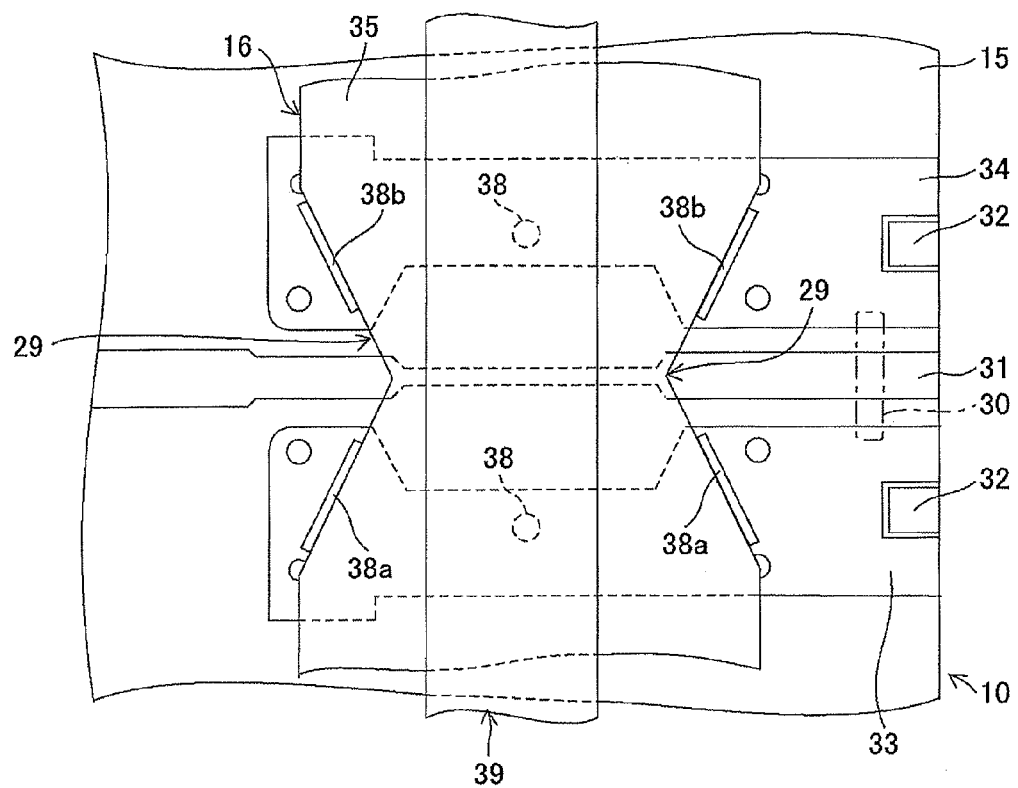
FIG. 11 is a drawing illustrating another example of a frame-shaped dielectric layer of a high-frequency circuit package.

As illustrated in FIG. 10, the third ground line 38a may be formed to extend from the second indented part 29b to the first indented part 29a and the fourth ground line 38b may be formed to extend from the third indented part 29c to the first indented part 29a. Also, as illustrated in FIG. 11, the recess 29 may have a substantially triangular shape in plan view.

Figure 12:
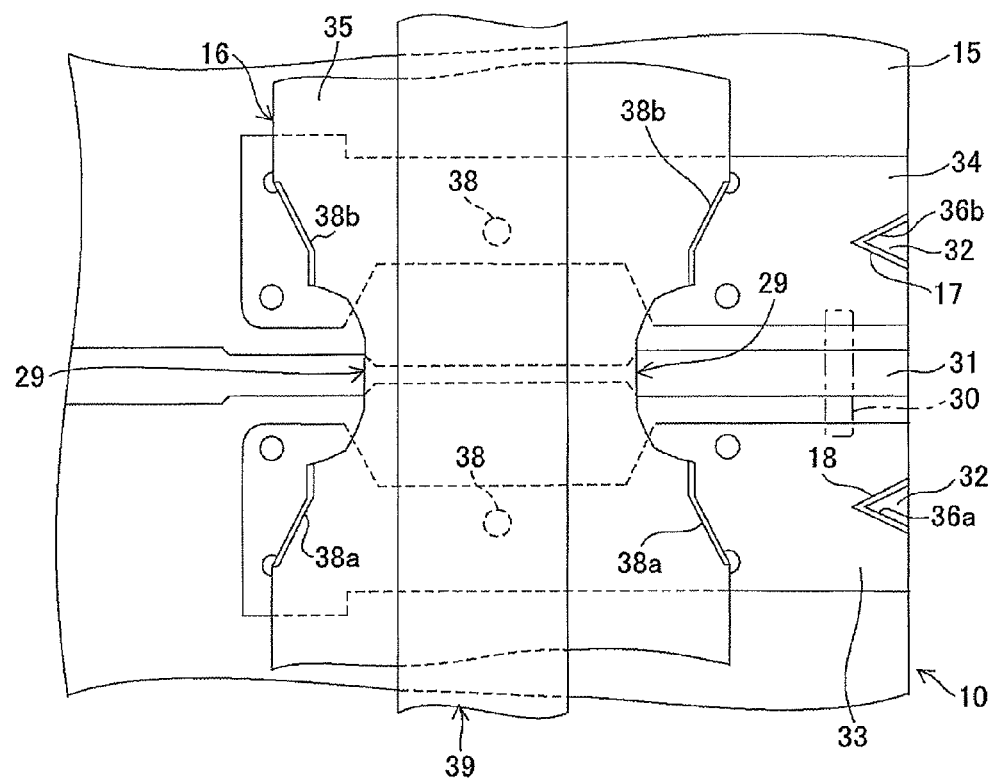
FIG. 12 is a drawing illustrating another example of castellation conductors of a high-frequency circuit package.

The shape of spaces defined by the recesses 17 and 18 formed at the ends of the second and third ground conductor layers 33 and 34 is not limited to a cubic shape. Alternatively, the spaces defined by the recesses 17 and 18 may have the shape of a triangular prism as illustrated in FIG. 12. Reducing the area of the recesses 17 and 18 in plan view makes it possible to increase the bonding areas of the second and third ground conductor layers 33 and 34.

In the above embodiment, it is assumed that the dielectric substrate 10 has an HTCC structure where multiple alumina layers are laminated. Alternatively, the dielectric substrate 10 may have an LTCC structure where glass ceramic layers are laminated as the dielectric layers.

Also in the above embodiment, a monolithic microwave integrated circuit (MMIC) is used as an example of the high-power device 3 mounted on the first component mounting area. Alternatively, a hybrid IC including a transistor chip and a matching circuit board may be mounted on the first component mounting area. The metal base 1, the protrusion 2, and the lid 40 may be made of a material with high radiation performance including, for example, diamond, Cu, Ag, and Al. Also, instead of AuSn, a conductive adhesive may be used to bond the lid 41.

According to an aspect of this disclosure, a high-frequency circuit package includes a dielectric substrate; a signal line, a first ground conductor layer, and a second ground conductor layer formed on the dielectric substrate; a frame-shaped dielectric layer overlapping parts of the signal line, the first ground conductor layer, and the second ground conductor layer; and a third ground conductor layer formed on the upper surface of the frame-shaped dielectric layer. A recess is formed in a side surface of a part of the frame-shaped dielectric layer above the signal line, the first ground conductor layer, and the second ground conductor layer. The recess includes a first surface located above the first ground conductor layer and extending laterally at an oblique angle with respect to the length direction of the signal line and a second surface located above the second ground conductor layer and extending laterally at an oblique angle with respect to the length direction of the signal line. First and second ground lines are formed on the first and second surfaces.

With this configuration, the first ground line electrically connects the third ground conductor layer and the first ground conductor layer on and below the frame-shaped conductor layer. Similarly, the second ground line electrically connects the third ground conductor layer and the second ground conductor layer.

Since the first ground line and the second ground line are not parallel to each other, the parasitic capacitance between the first ground line and the second ground line does not greatly increase even if their areas are increased. Also, since the first ground line and the second ground line extend at an oblique angle with respect to the length direction of the signal line, it is possible to reduce the distance between the first ground line and the second ground line and thereby to reduce the loss of a high-frequency signal.

The high-frequency circuit device according to the embodiment of the present invention may be used for a system device such as a communication device, a radar, a sensor, or an interference unit. Using the high-frequency circuit device of the above embodiment makes it possible to mount a small, high-performance semiconductor circuit on a system device and thereby makes it possible to improve the performance and to reduce the size of the system device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. A high-frequency circuit package, comprising:
   a dielectric substrate including an edge area;
   a signal line formed on the dielectric substrate and extending from the edge area toward an inner area of the dielectric substrate;
   a first ground conductor layer and a second ground conductor layer formed on sides of the signal line and disposed at a distance from the signal line;
   a frame-shaped dielectric layer formed on the dielectric substrate to overlap parts of the signal line, the first ground conductor layer, and the second ground conductor layer and to expose the signal line, the first ground conductor layer, and the second ground conductor layer in the edge area;
   a third ground conductor layer formed on an upper surface of the frame-shaped dielectric layer;
   a first recess formed in the frame-shaped dielectric layer above the signal line, the first ground conductor layer, and the second ground conductor layer, wherein the first recess includes
      a first surface located above the first ground conductor layer and extending laterally at an oblique angle with respect to a length direction of the signal line, and
      a second surface located above the second ground conductor layer and extending laterally at an oblique angle with respect to the length direction of the signal line;
   a first ground line formed on the first surface of the first recess and configured to electrically connect the first ground conductor layer with the third ground conductor layer; and
   a second ground line formed on the second surface of the first recess and configured to electrically connect the second ground conductor layer with the third ground conductor layer.

2. The high-frequency circuit package as claimed in claim 1, wherein
   the first recess further includes a central surface located above the signal line; and
   the first surface and the second surface are at an angle with the central surface.

3. The high-frequency circuit package as claimed in claim 1, wherein a pair of the first recesses are formed in inner and outer side surfaces of the frame-shaped dielectric layer symmetrically to each other.

4. The high-frequency circuit package as claimed in claim 3, wherein a width of a part of the frame-shaped dielectric layer located between the pair of the first recesses and above the signal line is narrower than widths of parts of the frame-shaped dielectric layer located between the pair of the first recesses and above the first ground conductor layer and the second ground conductor layer.

5. The high-frequency circuit package as claimed in claim 1, wherein the first surface and the second surface of the first recess are at an angle with each other.

6. The high-frequency circuit package as claimed in claim 1, wherein a width of a part of the signal line under the frame-shaped dielectric layer is narrower than widths of other parts of the signal line.

7. The high-frequency circuit package as claimed in claim 1, wherein distances between the signal line and parts of the first ground conductor layer and the second ground conductor layer under the frame-shaped dielectric layer are longer than distances between the signal line and other parts of the first ground conductor layer and the second ground conductor layer.

8. The high-frequency circuit package as claimed in claim 1, further comprising:
   at least one dielectric protrusion formed in the edge area at a distance from the first recess and intersecting with the first ground conductor layer and the second ground conductor layer.

9. The high-frequency circuit package as claimed in claim 8, further comprising:
   a first connection conductor configured to connect parts of the first ground conductor layer across the dielectric protrusion; and
   a second connection conductor configured to connect parts of the second ground conductor layer across the dielectric protrusion.

10. The high-frequency circuit package as claimed in claim 1, further comprising:
    a first via hole formed in the frame-shaped dielectric layer and configured to electrically connect the first ground conductor layer with the third ground conductor layer; and
    a second via hole formed in the frame-shaped dielectric layer and configured to electrically connect the second ground conductor layer with the third ground conductor layer.

11. The high-frequency circuit package as claimed in claim 10, wherein a distance between the first via hole and the second via hole is less than or equal to one half of an effective wavelength.

12. The high-frequency circuit package as claimed in claim 1, further comprising:
    dielectric layers constituting the dielectric substrate;
    a fourth ground conductor layer formed between an adjacent pair of the dielectric layers;
    a second recess formed at an end of the first ground conductor layer in the edge area, the second recess passing through the first ground conductor layer and one or more of the dielectric layers below the first ground conductor layer to expose a part of the fourth ground conductor layer;
    a third ground line formed on inner surfaces of the second recess and configured to electrically connect the first ground conductor layer with the fourth ground conductor layer;
    a third recess formed at an end of the second ground conductor layer in the edge area, the third recess passing through the second ground conductor layer and one or more of the dielectric layers below the second ground conductor layer to expose a part of the fourth ground conductor layer; and
    a fourth ground line formed on inner surfaces of the third recess and configured to electrically connect the second ground conductor layer with the fourth ground conductor layer.

13. The high-frequency circuit package as claimed in claim 12, further comprising:
    wires formed between the dielectric layers.

14. The high-frequency circuit package as claimed in claim 1, further comprising:
    a metal frame formed on the third ground conductor layer; and
    a lid bonded to the metal frame to cover a space surrounded by the frame-shaped dielectric layer.

15. A high-frequency circuit device, comprising:
    a dielectric substrate including an edge area;
    a signal line formed on the dielectric substrate and extending from the edge area toward an inner area of the dielectric substrate;
    a first ground conductor layer and a second ground conductor layer formed on sides of the signal line and disposed at a distance from the signal line;
    a frame-shaped dielectric layer formed on the dielectric substrate to overlap parts of the signal line, the first ground conductor layer, and the second ground conductor layer and to expose the signal line, the first ground conductor layer, and the second ground conductor layer in the edge area;
    a third ground conductor layer formed on an upper surface of the frame-shaped dielectric layer;
    a first recess formed in the frame-shaped dielectric layer above the signal line, the first ground conductor layer, and the second ground conductor layer, wherein the first recess includes
       a first surface located above the first ground conductor layer and extending laterally at an oblique angle with respect to a length direction of the signal line, and
       a second surface located above the second ground conductor layer and extending laterally at an oblique angle with respect to the length direction of the signal line;
    a first ground line formed on the first surface of the first recess and configured to electrically connect the first ground conductor layer with the third ground conductor layer;
    a second ground line formed on the second surface of the first recess and configured to electrically connect the second ground conductor layer with the third ground conductor layer; and
    a component mounted in an area on the dielectric substrate surrounded by the frame-shaped dielectric layer and connected with the signal line.

* * * * *